(12) United States Patent
Iwagami et al.

(10) Patent No.: US 7,683,678 B2
(45) Date of Patent: Mar. 23, 2010

(54) INVERTER CIRCUIT

(75) Inventors: Toru Iwagami, Tokyo (JP); Mamoru Seo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/076,575

(22) Filed: Mar. 20, 2008

(65) Prior Publication Data

US 2008/0211547 A1 Sep. 4, 2008

Related U.S. Application Data

(62) Division of application No. 10/898,364, filed on Jul. 26, 2004, now abandoned.

(30) Foreign Application Priority Data

Nov. 28, 2003 (JP) .............................. 2003-398732

(51) Int. Cl.
*H03B 1/00* (2006.01)
*H03K 3/00* (2006.01)

(52) U.S. Cl. .................... 327/108; 315/224; 315/307; 315/DIG. 7

(58) Field of Classification Search ........................ None
See application file for complete search history.

(56) References Cited

U.S. PATENT DOCUMENTS

| | | | |
|---|---|---|---|
| 5,198,699 A | 3/1993 | Hashimoto et al. | |
| 5,801,557 A | 9/1998 | Dubhashi et al. | |
| 5,828,184 A * | 10/1998 | Nadd | 315/209 R |
| 5,959,473 A | 9/1999 | Sakuragi | |
| 6,008,593 A | 12/1999 | Ribarich | |
| 6,107,751 A | 8/2000 | Billings | |
| 6,107,860 A | 8/2000 | Vinciarelli | |
| 6,172,466 B1 | 1/2001 | Ki et al. | |
| 6,211,623 B1 | 4/2001 | Wilhelm et al. | |
| 6,218,788 B1 | 4/2001 | Chen et al. | |
| 6,226,192 B1 | 5/2001 | Yamanaka et al. | |
| 6,316,887 B1 | 11/2001 | Ribarich et al. | |

(Continued)

FOREIGN PATENT DOCUMENTS

JP 05-083957 4/1993

(Continued)

OTHER PUBLICATIONS

Japanese Office Action, w/ English translation thereof, issued in Japanese Patent Application No. JP 2003-398732 dated on Dec. 9, 2008.

(Continued)

*Primary Examiner*—Tuan Lam

(57) ABSTRACT

An inverter circuit includes an IGBT (3) and an IGBT (4) connected in series between a power supply potential (Vcc) and a GND potential, and an HVIC (1) and an LVIC (2) for respectively controlling actuation of the IGBTs (3) and (4). The inverter circuit also includes a capacitor (5), a diode (6), and a resistor (7). The capacitor (5) is connected between a terminal (VS) and the GND potential. The diode (6) has a series connection to the capacitor (5) between the terminal (VS) and the GND potential, with such a polarity that a forward current flows from the GND potential to the terminal (VS). The resistor (7) is connected in parallel to the capacitor (5).

1 Claim, 15 Drawing Sheets

U.S. PATENT DOCUMENTS

| | | |
|---|---|---|
| 6,617,805 B2 | 9/2003 | Ribarich et al. |
| 6,734,706 B2 | 5/2004 | Yoshida et al. |
| 6,949,888 B2 | 9/2005 | Ribarich |
| 6,956,336 B2 | 10/2005 | Ribarich |
| 2002/0195682 A1 | 12/2002 | Satoh et al. |
| 2002/0196030 A1 | 12/2002 | Kamitani |
| 2004/0227471 A1 | 11/2004 | Ribarich |
| 2007/0273412 A1 | 11/2007 | Yoshida et al. |
| 2009/0096492 A1 | 4/2009 | Janssen |

FOREIGN PATENT DOCUMENTS

| | | |
|---|---|---|
| JP | 6-503938 | 4/1994 |
| JP | 9-219977 | 8/1997 |
| JP | 10-42575 | 2/1998 |
| JP | 2003-178895 | 6/2003 |
| WO | WO 01/59918 A1 | 8/2001 |

OTHER PUBLICATIONS

United States Office Action issued in U.S. Appl. No. 12/076,580 dated Dec. 1, 2009.

* cited by examiner

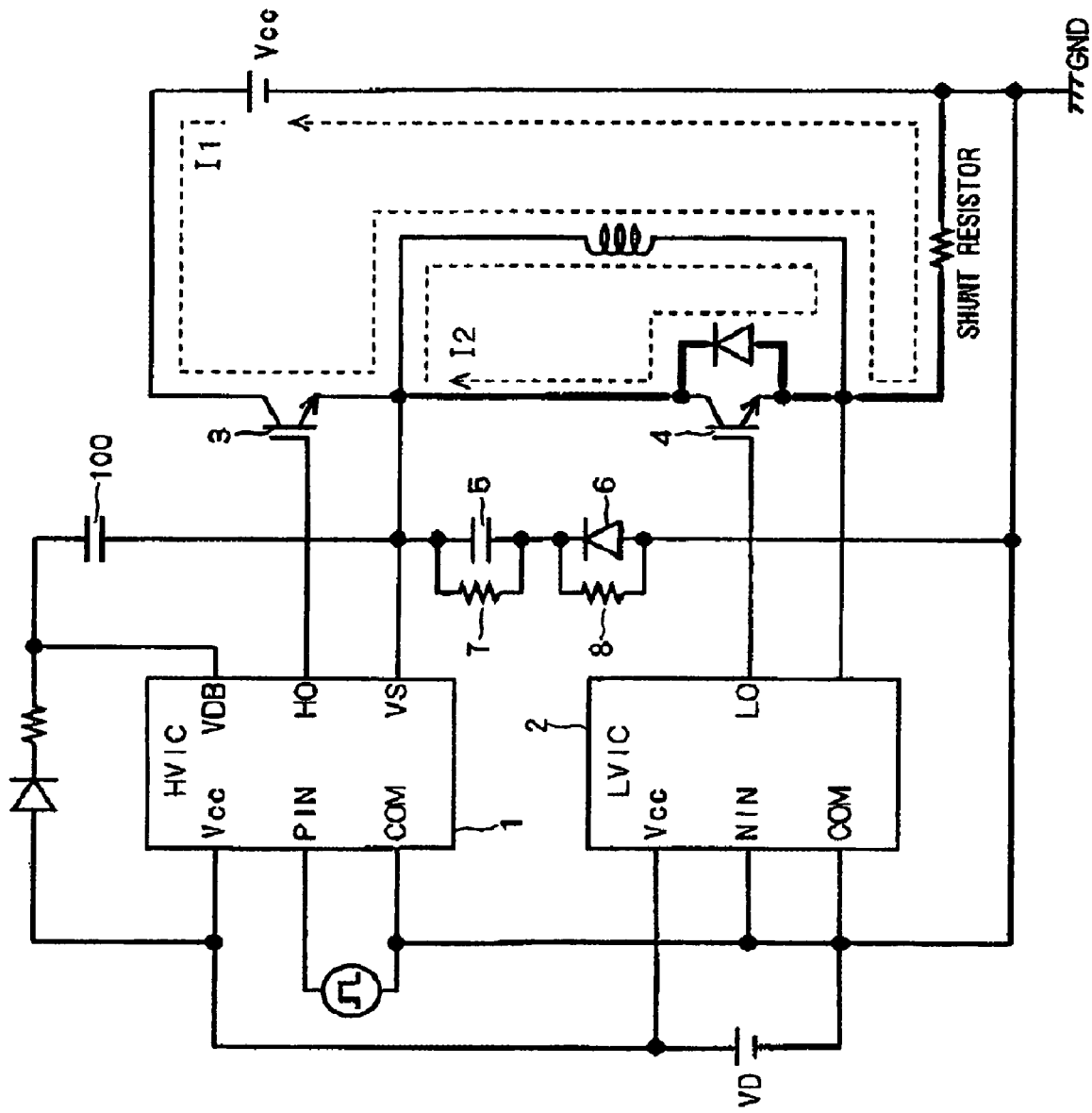
F I G. 3B

F I G . 1 4
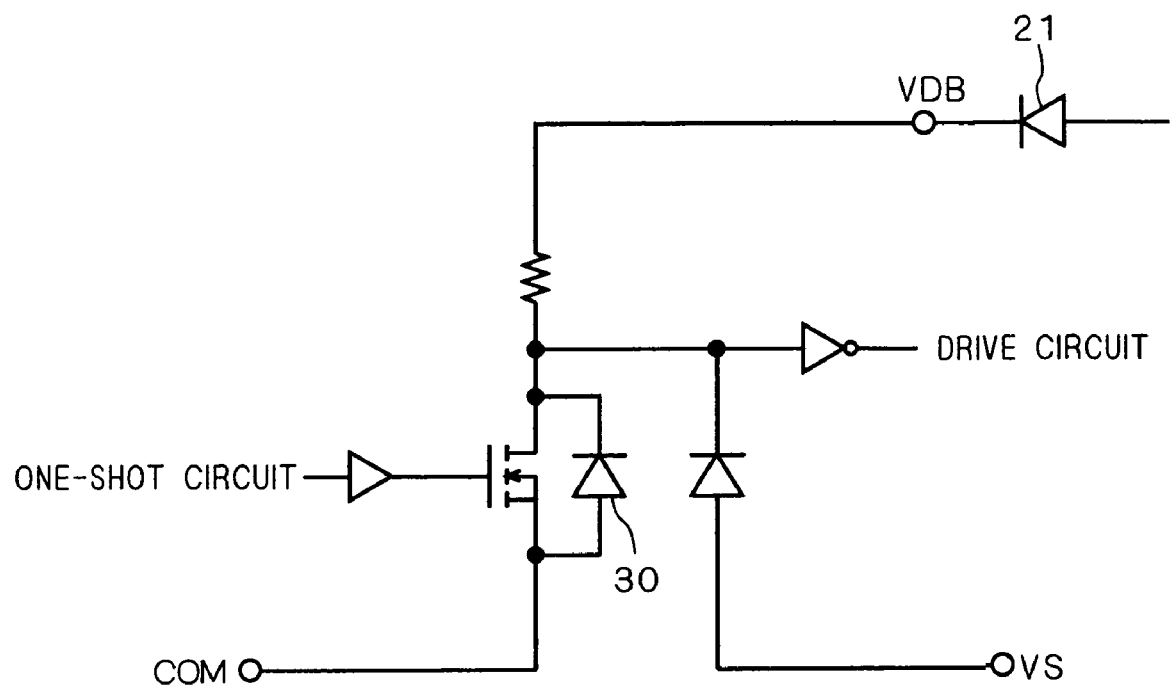

US 7,683,678 B2

INVERTER CIRCUIT

RELATED APPLICATIONS

This application is a Divisional of U.S. application Ser. No. 10/898,364, filed Jul. 26, 2004 now abandoned, claiming priority of Japanese Application No. 2003-398732, filed Nov. 28, 2003, the entire contents of each of which are hereby incorporated by reference.

BACKGROUND OF THE INVENTION

1. Field of the Invention

The present invention relates to an inverter circuit.

2. Description of the Background Art

An inverter circuit generally includes high-voltage and low-voltage switching elements connected in series between a power supply potential and a GND potential, and high-voltage and low-voltage drive circuits for respectively controlling actuation of the high-voltage and low-voltage switching elements. The inverter circuit conventionally used is introduced in Japanese Patent Application Laid-Open Nos. 2003-178895, 9-219977 (1997), 10-42575 (1998), and in PCT Publication No. WO 01/59918, for example.

The conventional inverter circuit faces the problem below.

At the time when the high-voltage switching element is turned off, the inverter circuit is placed in a free-wheeling mode of an FWD connected in inverse-parallel to the low-voltage switching element (FWD of the lower arm). At this time, a negative surge voltage is generated at an output terminal of the inverter circuit, which voltage is the product of di/dt during turn-off of the high-voltage switching element and an inductance in a free-wheeling loop of the FWD of the lower arm. This surge voltage, when being at a predetermined level or higher, may cause breakdown or malfunction of the high-voltage drive circuit. A higher switching current is likely to generate increase in surge voltage, thus causing difficulty in obtaining a large current-carrying capacity of the inverter circuit.

SUMMARY OF THE INVENTION

It is therefore an object of the present invention to obtain an inverter circuit capable of suppressing a negative surge voltage resulting from turn-off of a high-voltage switching element.

According to one aspect of the present invention, the inverter circuit includes a high-voltage switching element and a low-voltage switching element, a high-voltage drive circuit, a capacitor, a diode, and a resistor. The high-voltage and low-voltage switching elements are connected in series between a power supply potential and a GND potential. The high-voltage drive circuit has a terminal connected to a current emission terminal of the high-voltage switching element while supplying a reference potential of a high-potential inner circuit. The terminal of the high-voltage drive circuit will be referred to as a terminal VS. The diode has a series connection to the capacitor between the terminal VS and the GND potential, with such a polarity that a forward current flows from the GND potential to the terminal VS. The resistor is connected in parallel either to the diode or to the capacitor, or both.

A negative surge voltage as a result of turn-off of the high-voltage switching element is suppressed accordingly.

According to another aspect of the present invention, the inverter circuit includes a high-voltage switching element and a low-voltage switching element, a high-voltage drive circuit, and a diode. The high-voltage and low-voltage switching elements are connected in series between a power supply potential and a GND potential. The high-voltage drive circuit has a terminal connected to the GND potential while supplying a reference potential of a low-potential inner circuit. The terminal will be referred to as a terminal COM. The diode is connected between the terminal COM and the GND potential, with such a polarity that a forward current flows form the terminal COM to the GND potential.

A negative surge voltage as a result of turn-off of the high-voltage switching element is suppressed accordingly.

According to still another aspect of the present invention, the inverter circuit includes a high-voltage switching element and a low-voltage switching element, a high-voltage drive circuit, and a diode. The high-voltage and low-voltage switching elements are connected in series between a power supply potential and a GND potential. The high-voltage drive circuit has a terminal connected through a bootstrap power supply capacitor to a current emission terminal of the high-voltage switching element. The terminal of the high-voltage drive circuit will be referred to as a terminal VDB. The diode has a series connection to the bootstrap power supply capacitor between the current emission terminal and the terminal VDB, with such a polarity that a forward current flows from the current emission terminal to the terminal VDB.

A negative surge voltage as a result of turn-off of the high-voltage switching element is suppressed accordingly.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are circuit diagrams respectively showing the configuration of a modified inverter circuit according to the first preferred embodiment;

FIG. 14 is a circuit diagram showing the configuration inside the level shift circuit of FIG. 2 when a diode is connected to a terminal VDB of the HVIC.

DESCRIPTION OF THE PREFERRED EMBODIMENTS

First Preferred Embodiment

Figure 1:
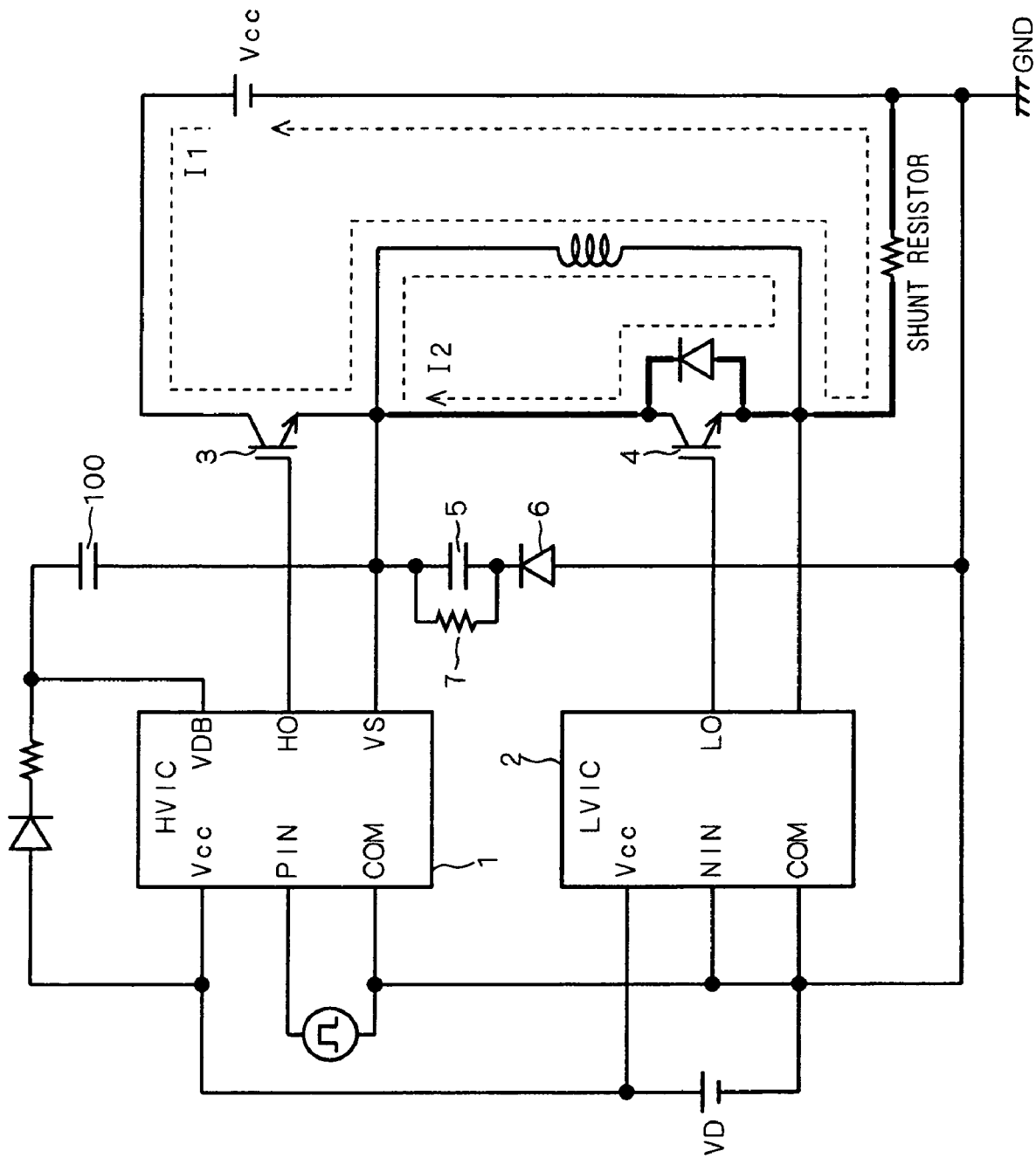
FIG. 1 is a circuit diagram showing the configuration of an inverter circuit according to a first preferred embodiment of the present invention.

FIG. 1 is a circuit diagram showing the configuration of an inverter circuit according to a first preferred embodiment of the present invention. The inverter circuit is of two or more phases (generally three phases), whereas FIG. 1 shows the configuration of a single-phase circuit. The configuration of FIG. 1 is an extracted portion from the inverter circuit which is mainly relevant to the present invention. The inverter circuit includes a series connection of an IGBT (high-voltage switching element) 3 and an IGBT (low-voltage switching element) 4 between a power supply potential Vcc and a GND potential, and an HVIC (high-voltage drive circuit) 1 and an LVIC (low-voltage drive circuit) 2 for respectively controlling actuation of the IGBTs 3 and 4.

Figure 2:
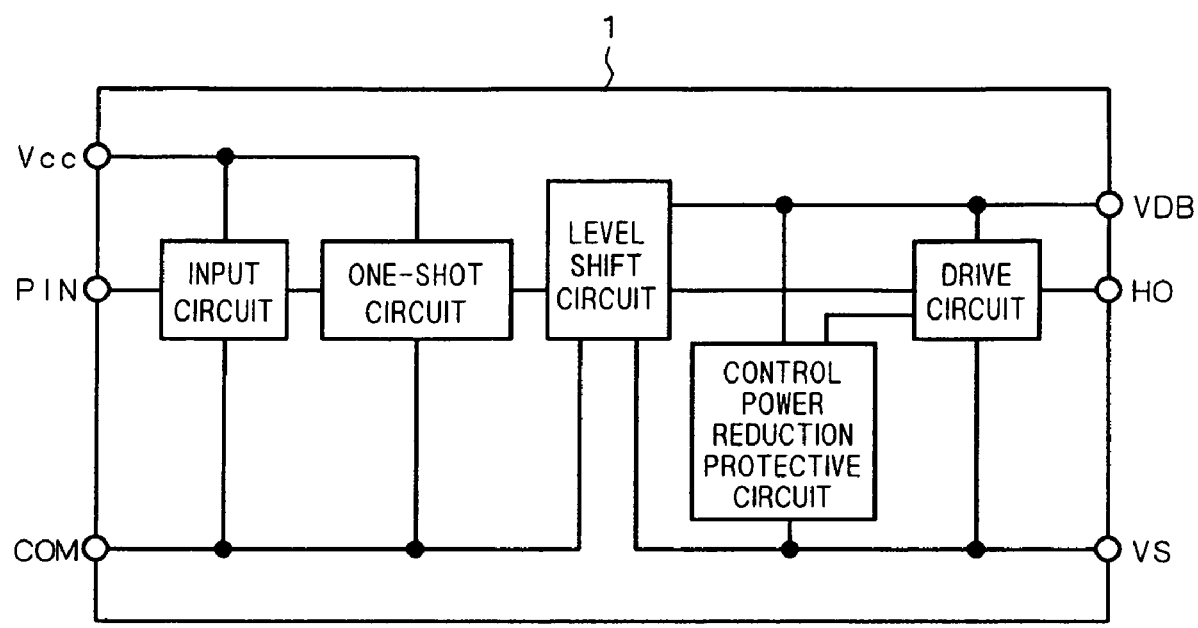
FIG. 2 is a circuit diagram schematically showing the configuration inside an HVIC.

FIG. 2 is a circuit diagram schematically showing the configuration inside the HVIC 1. With reference to FIG. 2, the HVIC 1 includes an input circuit, a one-shot circuit, a level shift circuit, a control power reduction protective circuit, and a drive circuit. The configuration inside the HVIC 1 shown in FIG. 2 is common in second through seventh preferred embodiments discussed later.

With reference to FIGS. 1 and 2, the HVIC 1 has terminals Vcc, PIN, COM, VDB, HO and VS. The terminal Vcc receives power to drive a low-potential inner circuit of the HVIC 1 (including the input circuit and the one-short circuit shown in FIG. 2) from an external control power supply VD of about 15 V. The terminal PIN receives an input signal from an external microcomputer. The terminal COM is connected to the GND potential, and serves to supply a reference potential of the low-potential inner circuit. The terminal VDB is connected through a bootstrap power supply capacitor 100 to the emitter (current emission terminal) of the IGBT 3. The terminal HO is connected to the gate of the IGBT 3. The terminal VS is connected to the emitter of the IGBT 3, and serves to supply a reference potential of a high-potential inner circuit (including the control power reduction protective circuit and the drive circuit shown in FIG. 2).

With reference to FIG. 1, the inverter circuit includes the bootstrap power supply capacitor 100 which is charged by the control power supply VD when the IGBT 4 is in the on state. When the IGBT 3 is in the on state, the bootstrap power supply capacitor 100 supplies HVIC 1 with power to drive the high-potential inner circuit through the terminal VDB.

The inverter circuit further includes a capacitor 5, a diode 6, and a resistor 7. The capacitor 5 is connected between the terminal VS and the GND potential. The diode 6 has a series connection to the capacitor 5 between the terminal VS and the GND potential, with such a polarity that a forward current flows from the GND potential to the terminal VS. The resistor 7 is connected in parallel to the capacitor 5.

When the terminal PIN of the HVIC receives an on signal (high-level signal), the IGBT 3 is turned on to cause a current I1 to flow as shown in FIG. 1. When the terminal PIN thereafter receives an off signal (low-level signal), the IGBT 3 is turned off to cause a current I2 to flow as shown in FIG. 1. At the instant of flow of the current I2, a negative surge voltage is generated which is the product of di/dt during turn-off of the IGBT 3 and an inductance in bold-lined interconnection shown in FIG. 1.

As discussed in the description of the background art, a surge voltage at an excessive level may cause breakdown or malfunction of the HVIC 1. In response, the inverter circuit of the first preferred embodiment is allowed to suppress a surge voltage by means of a series connection of the capacitor 5 and the diode 6 between the terminal VS and the GND potential. Further, as the first preferred embodiment prevents flow of a direct current, the inverter circuit can be constituted by the inexpensive capacitor 5 and the diode 6. The first preferred embodiment still further characteristically uses the resistor 7 to discharge electric charges stored in the capacitor 5 resulting from a surge voltage, thus advantageously preventing reduction in surge absorption by the capacitor 5.

Figure 3A:
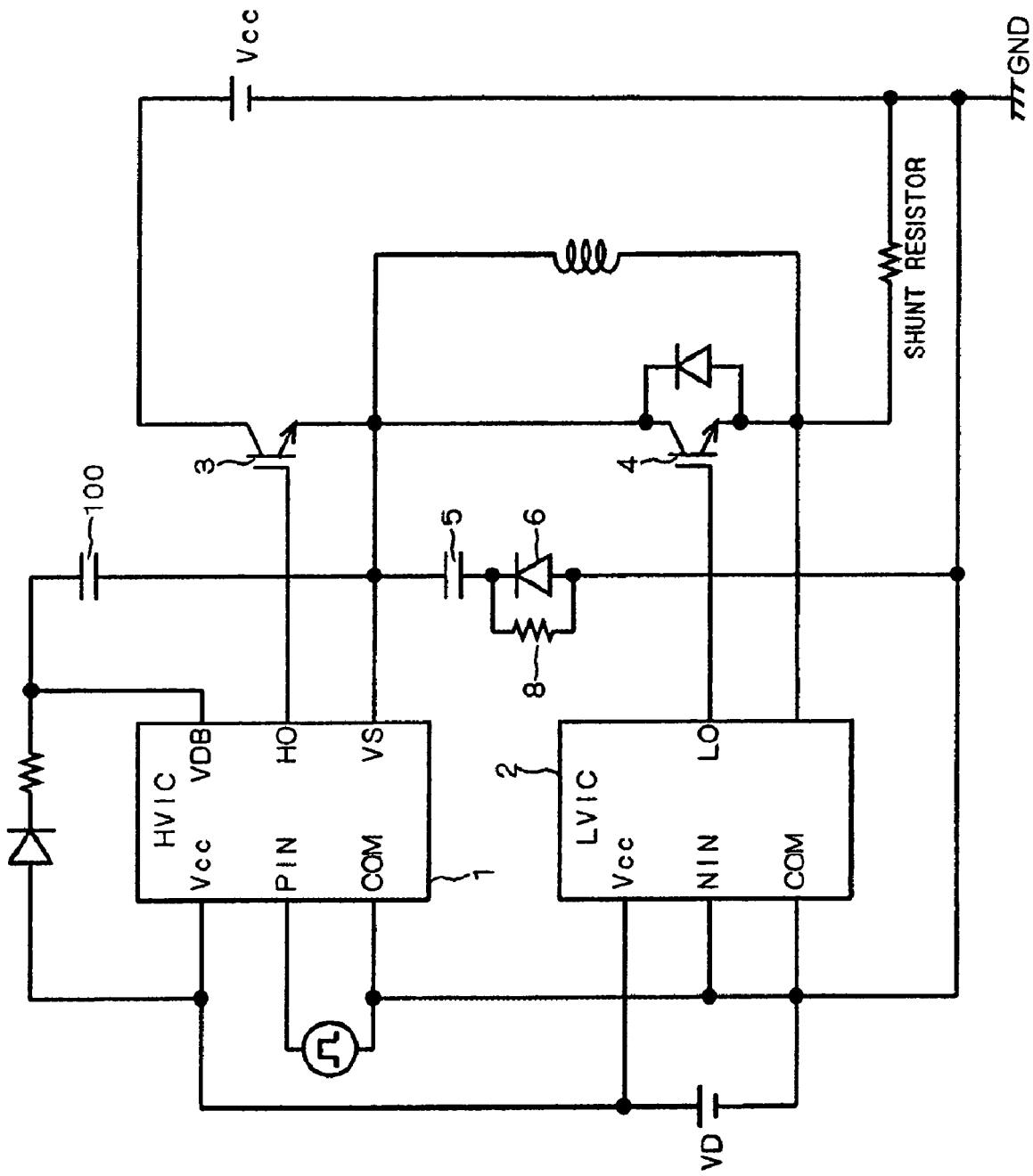

FIG. 3A is a circuit diagram corresponding to FIG. 1, showing the configuration of an inverter circuit according to a modification of the first preferred embodiment. The configuration of FIG. 1 has a parallel connection of the resistor 7 and the capacitor 5, whereas an alternative configuration of FIG. 3A has a parallel connection of a resistor 8 and the diode 6. Further alternatively, both the resistors 7 and 8 may be provided as shown in FIG. 3B. The inverter circuits shown in FIGS. 3A and 3B provide the same effect as obtained by the inverter circuit of FIG. 1.

Second Preferred Embodiment

Figure 4:
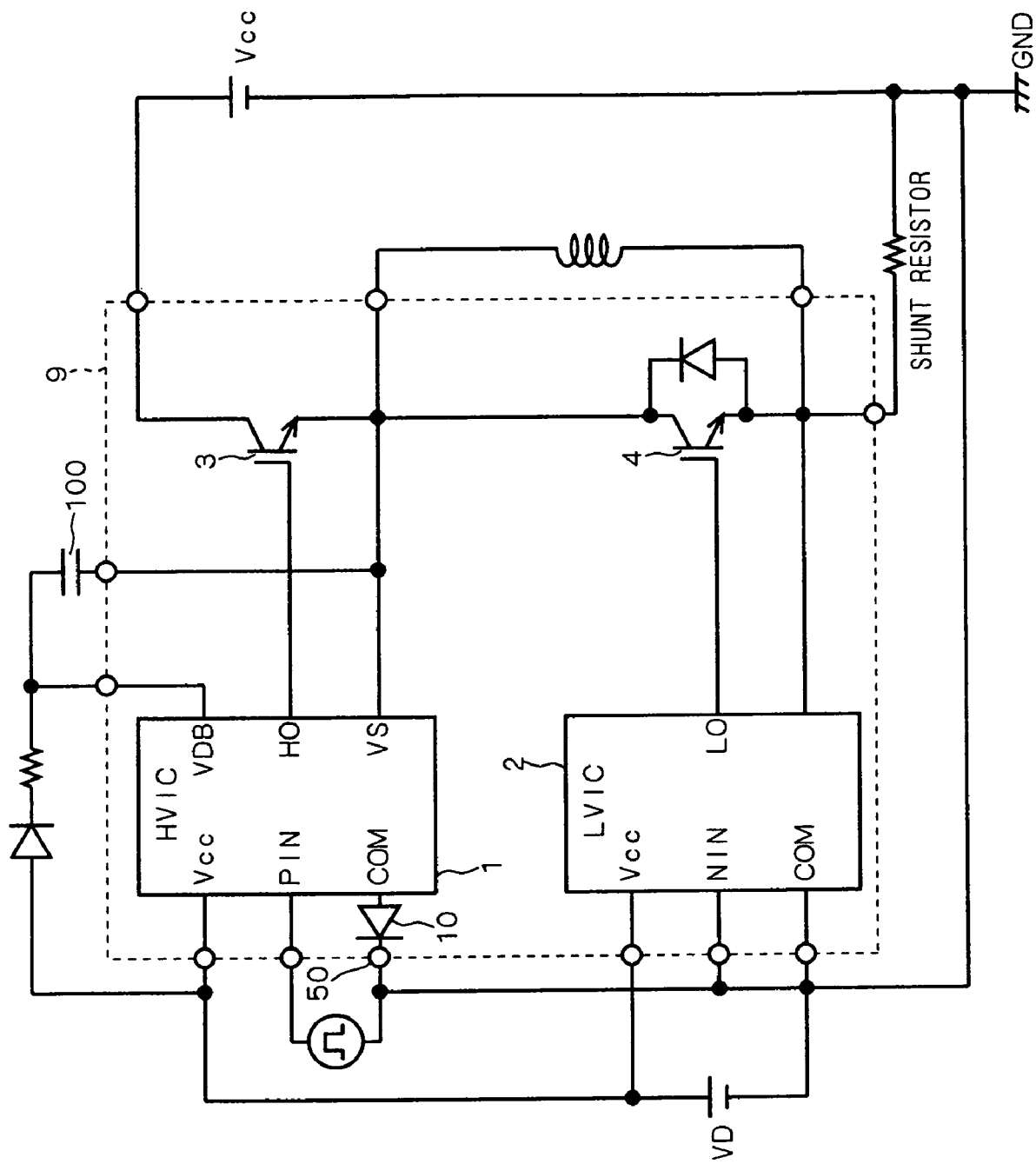
FIG. 4 is a circuit diagram showing the configuration of an inverter circuit according to a second preferred embodiment of the present invention.

FIG. 4 is a circuit diagram showing the configuration of an inverter circuit according to a second preferred embodiment of the present invention. The inverter circuit is of two or more phases (generally three phases), whereas FIG. 4 shows the configuration of a single-phase circuit. The configuration of FIG. 4 is an extracted portion from the inverter circuit which is mainly relevant to the present invention. Instead of the capacitor 5, the diode 6 and the resistor 7 shown in FIG. 1, the inverter circuit of the second preferred embodiment includes a diode 10 as an element to suppress a surge voltage resulting from turn-off of the IGBT 3. Together with the HVIC 1, the LVIC 2, and the IGBTs 3 and 4, the diode 10 is modularized as a DIP-IPM (dual-in-line package intelligent power module) 9. The diode 10 has an anode connected to the terminal COM of the HVIC 1, and a cathode connected to a terminal 50 of the DIP-IPM 9. The diode 10 is provided between the terminal COM of the HVIC 1 and the GND potential, with such a polarity that a forward current flows from the terminal COM of the HVIC 1 to the GND potential.

Figure 5:
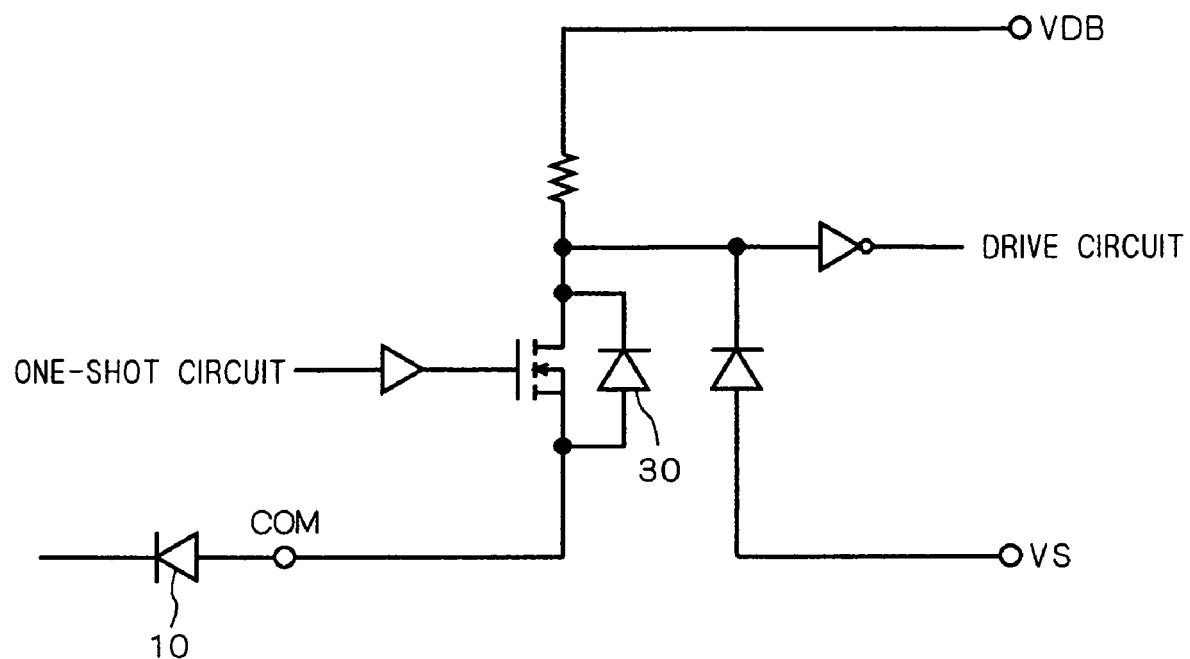
FIG. 5 is a circuit diagram showing the configuration inside a level shift circuit of FIG. 2 when a diode is connected to a terminal COM of the HVIC.

FIG. 5 is a circuit diagram showing the configuration inside the level shift circuit of FIG. 2 when the diode 10 is connected to the terminal COM of the HVIC 1.

With reference to FIG. 5, when the terminal VDB is subjected to application of a negative surge voltage resulting from turn-off of the IGBT 3, the diode 10 serves to provide voltage clamp (reverse blocking) between the terminals COM and VDB. As a result, the second preferred embodiment causes no application of a surge voltage at an excessive level between the terminals COM and VDB while preventing flow of a current, whereby the HVIC 1 is protected from breakdown or malfunction.

Third Preferred Embodiment

Figure 6:
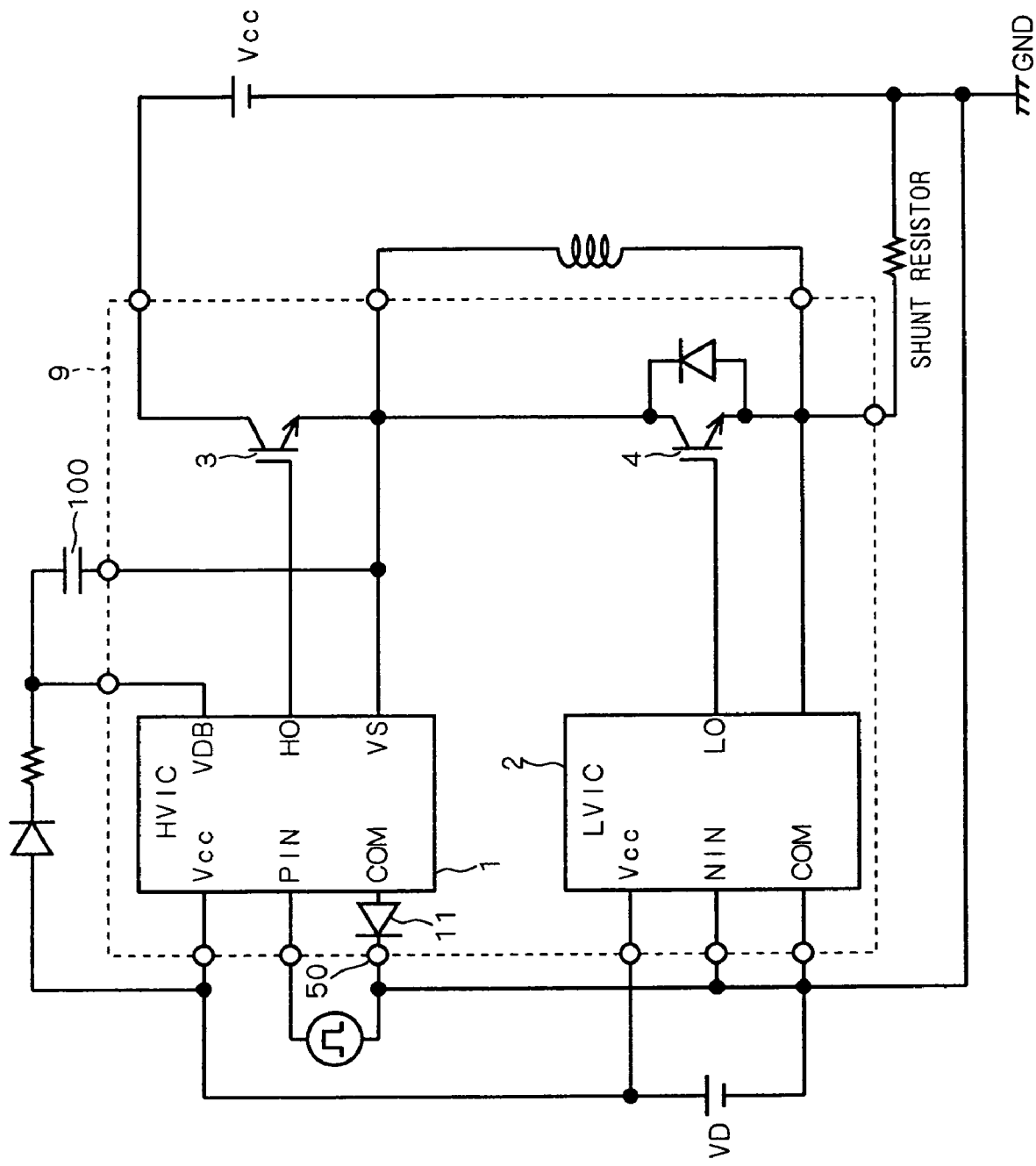
FIG. 6 is a circuit diagram corresponding to FIG. 4, showing the configuration of an inverter circuit according to a third preferred embodiment of the present invention.

FIG. 6 is a circuit diagram corresponding to FIG. 4, showing the configuration of an inverter circuit according to a third preferred embodiment of the present invention. In the inverter circuit of the third preferred embodiment, the usual diode 10 shown in FIG. 4 is replaced by a fast recovery diode 11 that is the same in polarity as the diode 10.

In the inverter circuit shown in FIG. 4, the diode 10 continuously receives a circuit current of the HVIC 1 supplied from the control power supply VD. When the terminal VDB is subjected to application of the foregoing negative surge voltage (that is, when the diode 10 is reverse biased by this negative surge voltage), the surge voltage is applied accordingly between the terminals COM and VDB in a recovery time of the diode 10. As a result, malfunction of the HVIC 1 is likely.

In response, in the inverter circuit of the third preferred embodiment, the usual diode 10 shown in FIG. 4 is replaced by the fast recovery diode 11. The fast recovery diode 11 requires shorter recovery time than the usual diode 10 and hence, application of the surge voltage between the terminals COM and VDB continues for a shorter length of time, whereby enhanced malfunction capability is obtained.

Fourth Preferred Embodiment

In the inverter circuit shown in FIG. 4 or 6, identifying the voltage at the control power supply VD as VD0, and a surge voltage applied across the diode 10 or the fast recovery diode 11 as VR0, a voltage of VD0+VR0 is applied between the terminals Vcc and COM of the HVIC 1. When the surge voltage VR0 has an excessive level and thus a voltage exceeding a rated voltage Vm is applied between the terminals Vcc and COM of the HVIC 1, breakdown of the HVIC 1 is likely.

Figure 7:
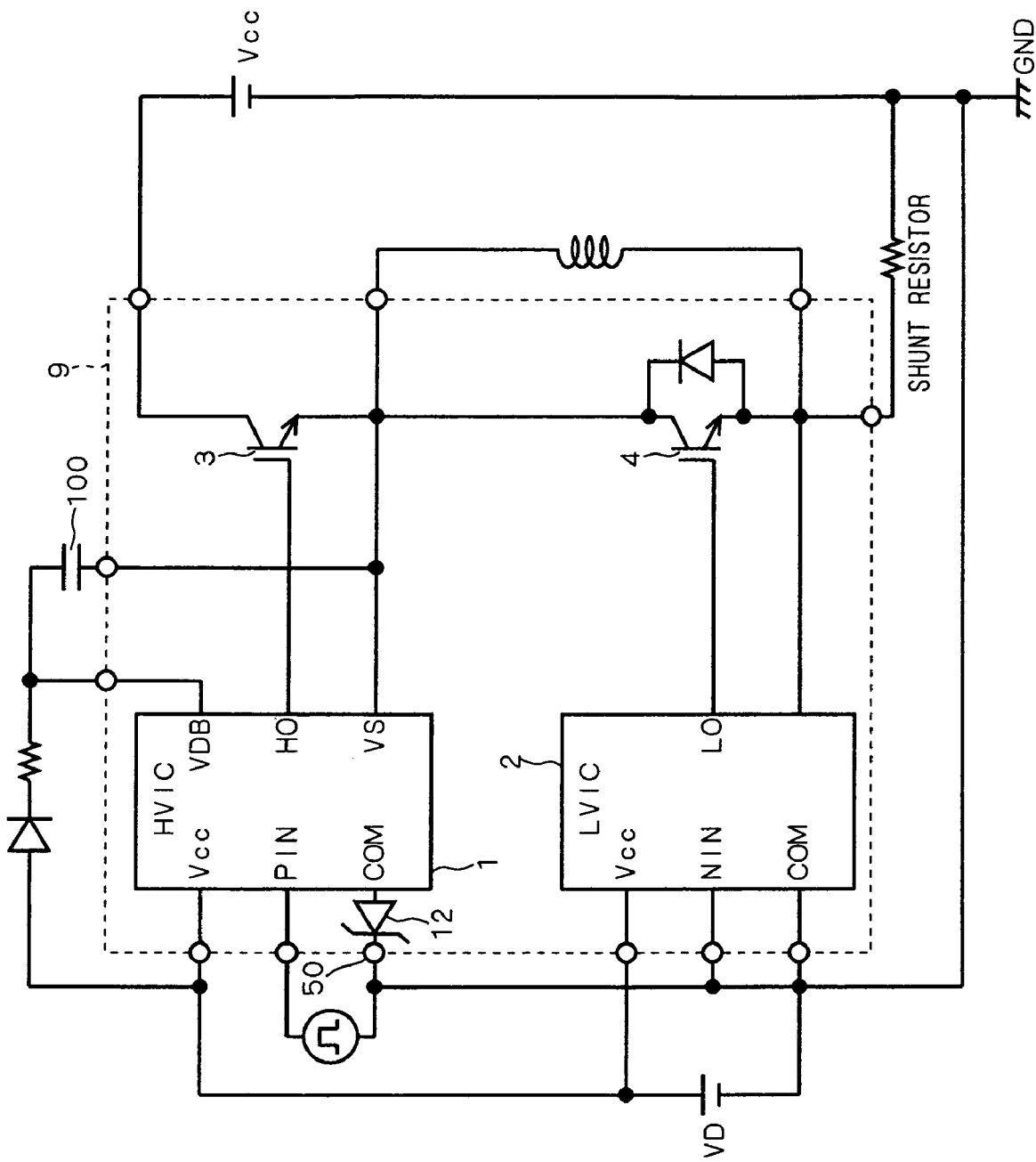
FIG. 7 is a circuit diagram corresponding to FIG. 4 or 6, showing the configuration of an inverter circuit according to a fourth preferred embodiment of the present invention.

FIG. 7 is a circuit diagram corresponding to FIG. 4 or 6, showing the configuration of an inverter circuit according to a fourth preferred embodiment of the present invention. In the inverter circuit of the fourth referred embodiment, the usual diode 10 of FIG. 4 or the fast recovery diode 11 of FIG. 6 is replaced by a Zener diode 12 having a Zener voltage Vz1 that is the same in polarity as the diode 10 or the fast recovery diode 11. The Zener voltage Vz1 of the Zener diode 12 has such a level that the sum of the voltages VD0 and Vz1 is not higher than the rated voltage Vm.

According to the inverter circuit of the fourth preferred embodiment, in the event of application of a surge voltage at an excessive level, the voltage between the terminals Vcc and COM of the HVIC 1 is clamped at the voltage of VD0+Vz1 which is not higher than the rated voltage Vm. As a result, breakage of the HVIC 1 is prevented.

Fifth Preferred Embodiment

As discussed in the fourth preferred embodiment above, when the surge voltage VR0 has an excessive level and thus a voltage exceeding the rated voltage Vm is applied between the terminals Vcc and COM of the HVIC 1, breakdown of the HVIC 1 is likely.

Figure 8:
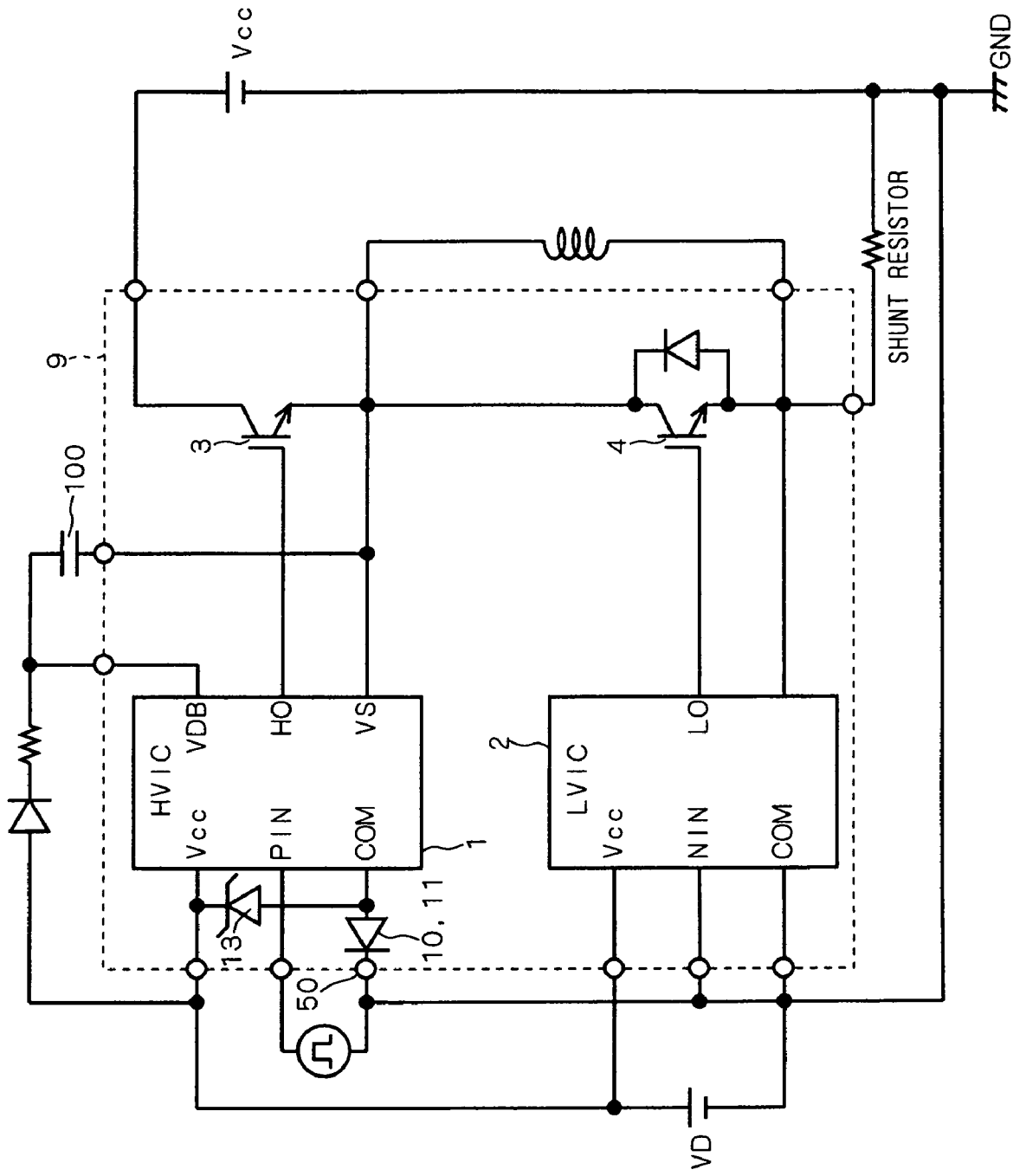
FIG. 8 is a circuit diagram corresponding to FIG. 4 or 6, showing the configuration of an inverter circuit according to a fifth preferred embodiment of the present invention.

FIG. 8 is a circuit diagram corresponding to FIG. 4 or 6, showing the configuration of an inverter circuit according to a fifth preferred embodiment of the present invention. The inverter circuit of the fifth preferred embodiment further includes a Zener diode 13 having a Zener voltage Vz2 in addition to the usual diode 10 of FIG. 4 or the fast recovery diode 11 of FIG. 6. The Zener diode 13 has an anode connected to the terminal COM of the HVIC 1, and a cathode connected to the terminal Vcc of the HVIC 1. The Zener voltage Vz2 of the Zener diode 13 has a level which is not higher than the rated voltage Vm between the terminals Vcc and COM of the HVIC 1.

According to the inverter circuit of the fifth preferred embodiment, in the event of application of a surge voltage at an excessive level, the voltage between the terminals Vcc and COM of the HVIC 1 is clamped at the Zener voltage Vz2 which is not higher than the rated voltage Vm. As a result, breakdown of the HVIC 1 is prevented.

Sixth Preferred Embodiment

Figure 9:
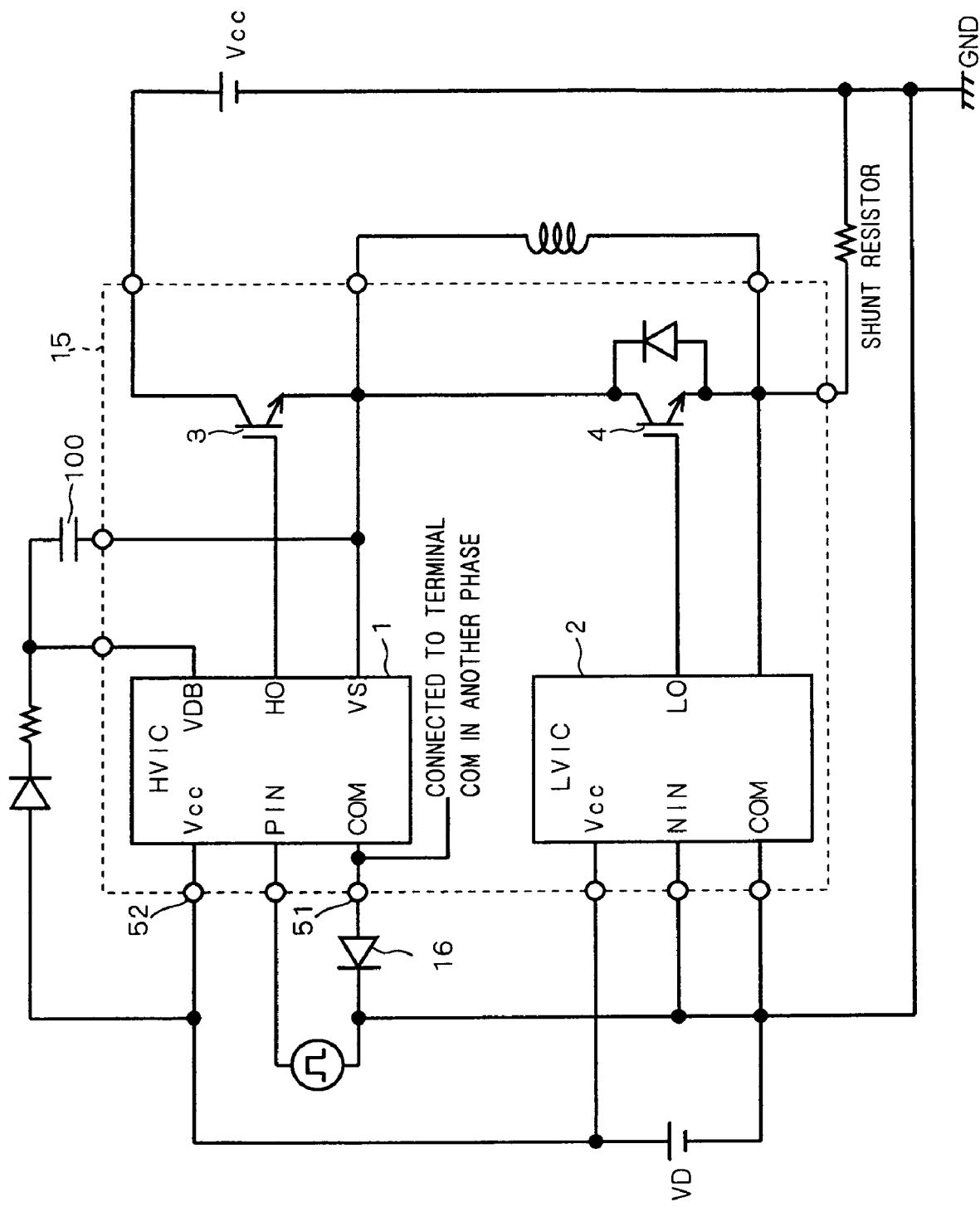
FIG. 9 is a circuit diagram corresponding to FIG. 4, showing a first configuration of an inverter circuit according to a sixth preferred embodiment of the present invention.

FIG. 9 is a circuit diagram corresponding to FIG. 4, showing a first configuration of an inverter circuit according to a sixth preferred embodiment of the present invention. FIG. 4 shows the single diode 10, whereas the inverter circuit actually has a configuration of two or more phases (generally three phases). The HVIC 1 and the control power supply VD are provided in each phase. That is, the diode 10 of FIG. 4 is provided responsive to the HVIC 1 in each phase.

In contrast, in the inverter circuit shown in FIG. 9, the terminals COM of the HVICs 1 in the respective phases are connected to each other in a DIP-IPM 15. That is, only one control power supply VD is required as a common control power supply among the HVICs 1 in two or more phases, thus correspondingly requiring only one diode 16 as a common diode among the HVICs 1 in two or more phases. The diode 16 is provided outside the DIP-IPM 15. The diode 16 has an anode connected to a terminal 51 of the DIP-IPM 15, and a cathode connected to the GND potential of the control power supply VD. The terminal 51 is connected to the terminals COM of the HVICs 1.

Figure 10:
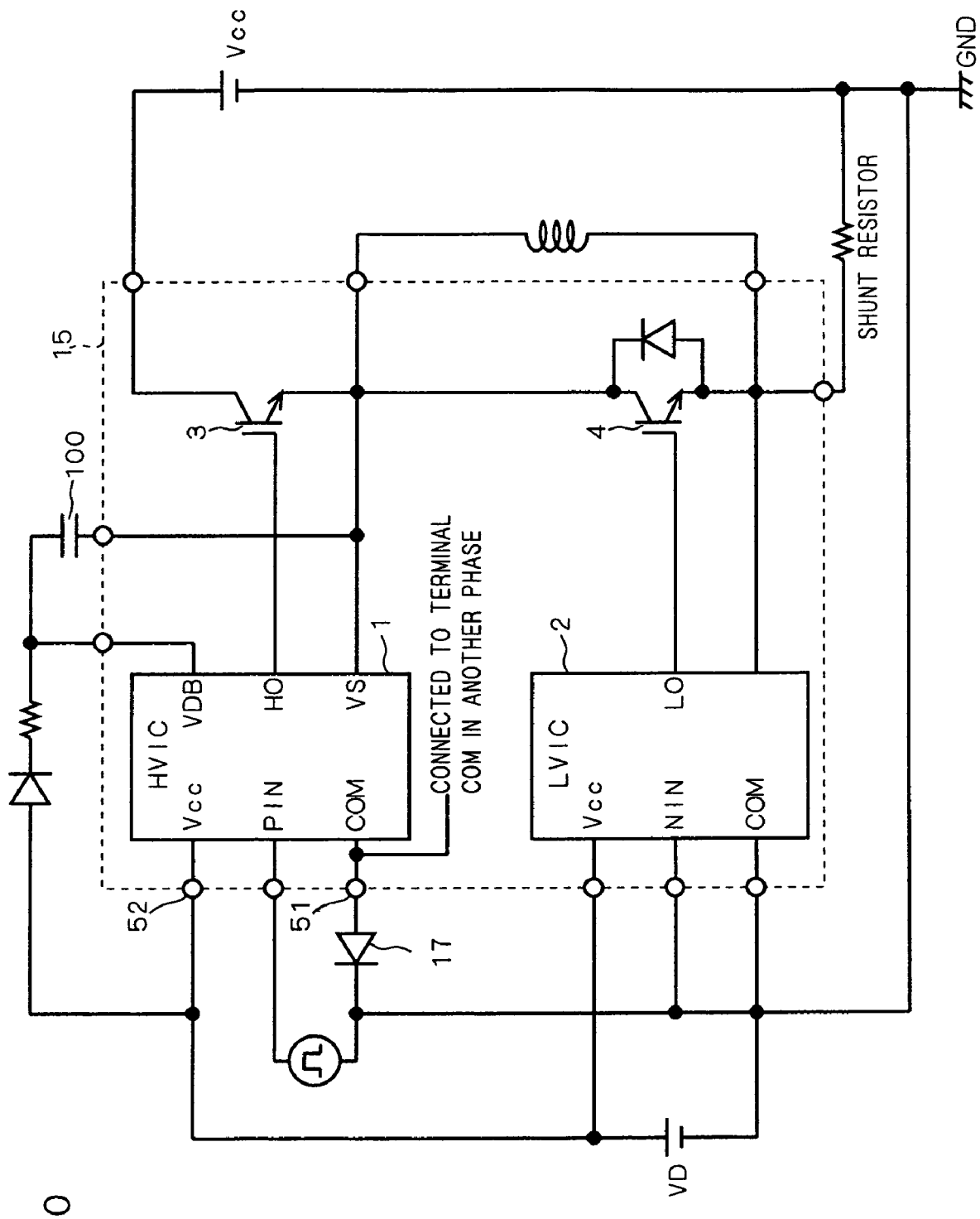
FIG. 10 is a circuit diagram corresponding to FIG. 6, showing a second configuration of the inverter circuit according to the sixth preferred embodiment.

FIG. 10 is a circuit diagram corresponding to FIG. 6, showing a second configuration of the inverter circuit according to the sixth preferred. The inverter circuit of FIG. 10 includes only one fast recovery diode 17 as a common diode among the HVICs 1 in two or more phases that replaces the fast recovery diode 11 (FIG. 6) which is provided responsive to the HVIC 1 in each phase.

Figure 11:
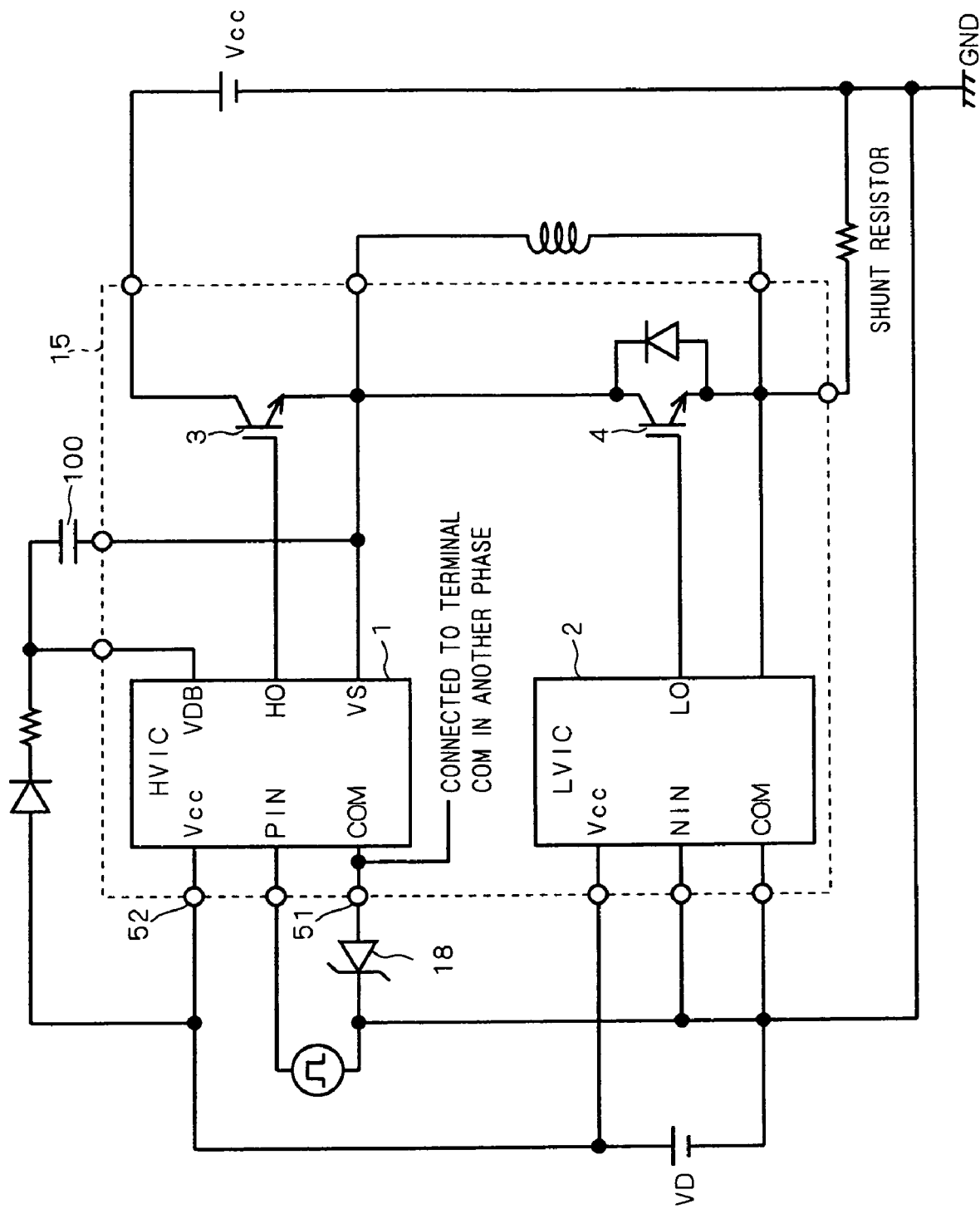
FIG. 11 is a circuit diagram corresponding to FIG. 7, showing a third configuration of the inverter circuit according to the sixth preferred embodiment.

FIG. 11 is a circuit diagram corresponding to FIG. 7, showing a third configuration of the inverter circuit according to the sixth preferred embodiment. The inverter circuit of FIG. 11 includes only one Zener diode 18 as a common diode among the HVICs 1 in two or more phases that replaces the Zener diode 12 (FIG. 7) which is provided responsive to the HVIC 1 in each phase.

Figure 12:
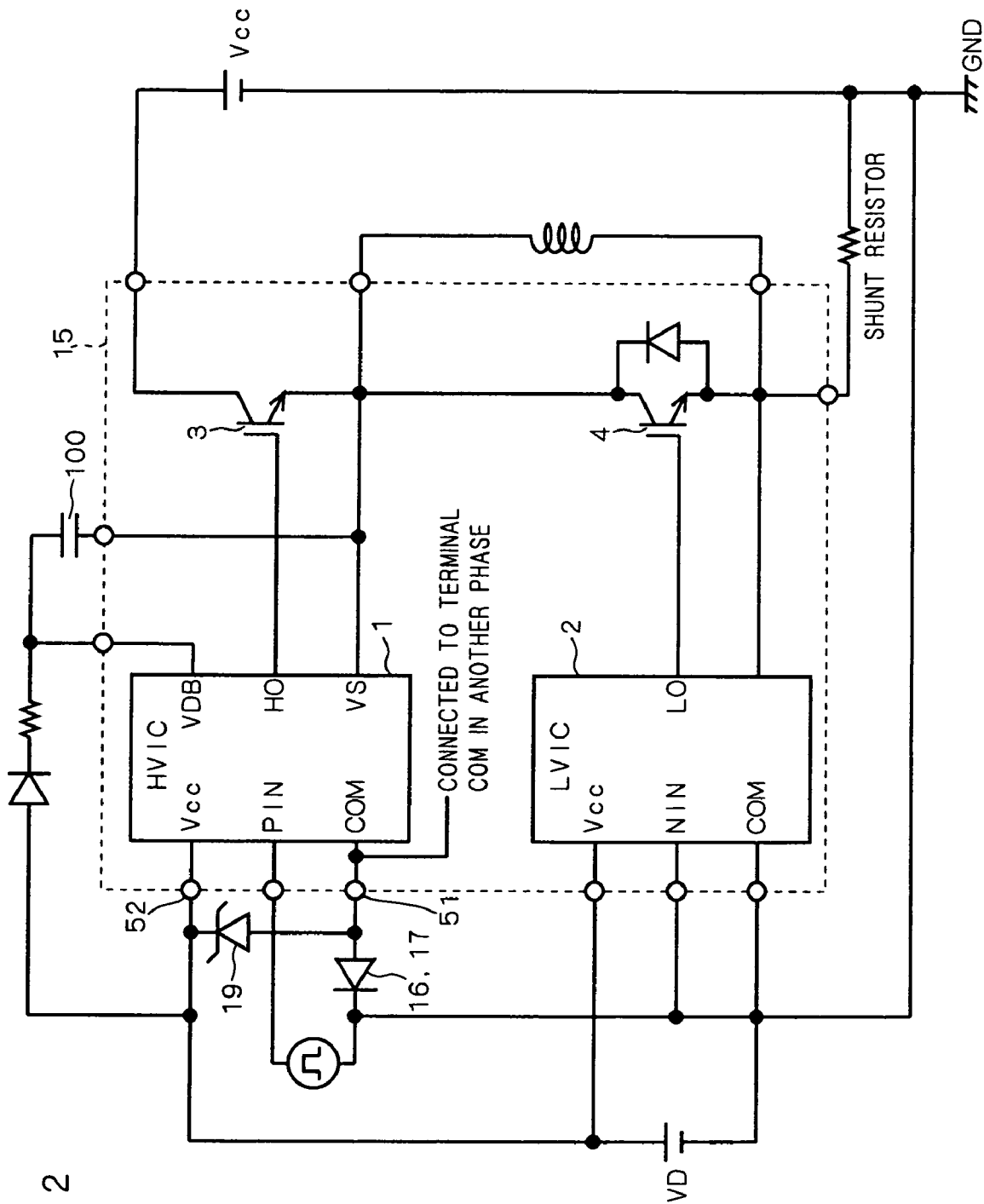
FIG. 12 is a circuit diagram corresponding to FIG. 8, showing a fourth configuration of the inverter circuit according to the sixth preferred embodiment.

FIG. 12 is a circuit diagram corresponding to FIG. 8, showing a fourth configuration of the inverter circuit according to the sixth preferred embodiment. In addition to the foregoing characteristics discussed with reference to FIG. 9 or 10, the inverter circuit of FIG. 12 includes only one Zener diode 19 as a common diode among the HVICs 1 in two or more phases that replaces the Zener diode 13 (FIG. 8) which is provided responsive to the HVIC 1 in each phase. The Zener diode 19 has an anode connected to the terminal 51 of the DIP-IPM 15, and a cathode connected to a terminal 52 of the DIP-IPM 15 having a connection to the terminals Vcc of the HVICs 1.

The inverter circuit of the sixth preferred embodiment characteristically includes the diode 16, the fast recovery diode 17, or the Zener diode 18 or 19 each serving as a common diode among the HVICs 1 in two or more phases. As compared with the configuration where these diodes are provided in each phase, the inverter circuit of the sixth preferred embodiment realizes simpler configuration.

Seventh Preferred Embodiment

Figure 13:
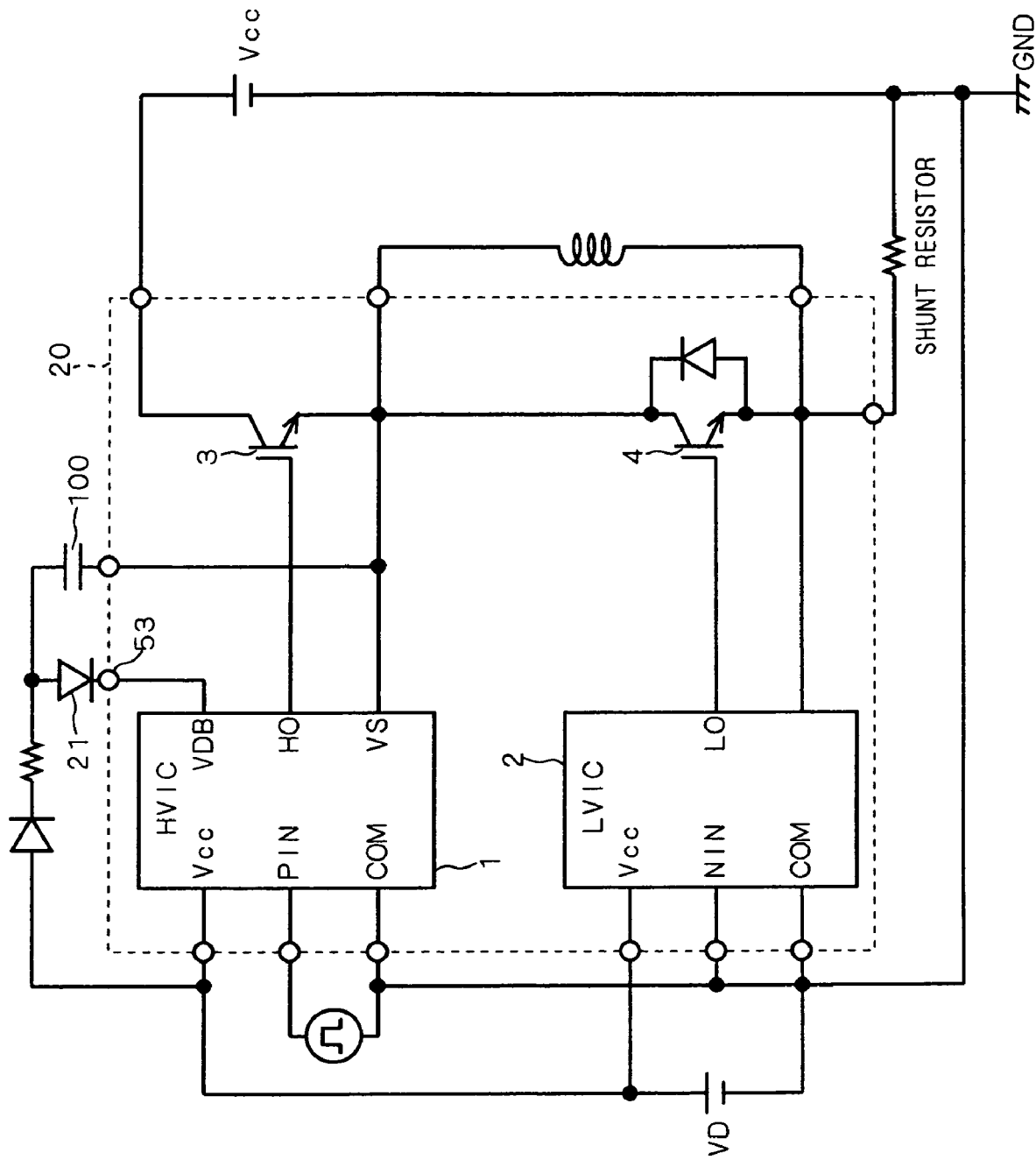
FIG. 13 is a circuit diagram showing the configuration of an inverter circuit according to a seventh preferred embodiment of the present invention.

FIG. 13 is a circuit diagram showing the configuration of an inverter circuit according to a seventh preferred embodiment of the present invention. The inverter circuit is of two or more phases (generally three phases), whereas FIG. 13 shows the configuration of a single-phase circuit. The configuration of FIG. 13 is an extracted portion from the inverter circuit which is mainly relevant to the present invention. Instead of the capacitor 5, the diode 6 and the resistor 7 shown in FIG. 1, the inverter circuit of the seventh preferred embodiment includes a diode 21 as an element to suppress a surge voltage resulting from turn-off of the IGBT 3. The diode 21 is provided outside a DIP-IPM 20. The diode 21 has an anode connected to the bootstrap power supply capacitor 100, and a cathode connected to a terminal 53 of the DIP-IPM 20. The terminal 53 is connected to the terminal VDB of the HVIC 1. The diode 21 thus has a series connection to the bootstrap power supply capacitor 100 between the emitter of the IGBT 3 and the terminal VDB of the HVIC 1, with such a polarity that a forward current flows from the emitter to the terminal VDB.

FIG. 14 is a circuit diagram showing the configuration inside the level shift circuit of FIG. 2 when the diode 21 is connected to the terminal VDB of the HVIC 1.

With reference to FIG. 14, when a negative surge voltage is applied to the terminal VDB resulting from turn-off of the IGBT 3, a diode 30 of FIG. 14 is forward biased to cause a current flow in the absence of the diode 21. This may interfere with level shifting to cause malfunction. In response, in the inverter circuit of the seventh preferred embodiment, the diode 21 connected to the terminal VDB serves to prevent such a current flow. As a result, the HVIC 1 is protected from malfunction.

While the invention has been shown and described in detail, the foregoing description is in all aspects illustrative and not restrictive. It is therefore understood that numerous modifications and variations can be devised without departing from the scope of the invention.

What is claimed is:
1. An inverter circuit, comprising:
   a high-voltage switching element and a low-voltage switching element connected in series between a power supply potential and a GND potential;
   a high-voltage drive circuit having a terminal connected through a bootstrap power supply capacitor to a current emission terminal of said high-voltage switching element, said terminal of said high-voltage drive circuit being referred to as a terminal VDB; and
   a diode coupled between said bootstrap power supply capacitor and said terminal VDB, with such a polarity that a forward current flows from said current emission terminal through the bootstrap power supply capacitor and the diode to said terminal VDB in this order.

* * * * *